(12) United States Patent
Kasama et al.

(10) Patent No.: US 8,397,917 B2
(45) Date of Patent: Mar. 19, 2013

(54) SEMICONDUCTOR WAFER CONTAINER

(75) Inventors: Nobuyuki Kasama, Chiba (JP); Yukihiro Hyobu, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 779 days.

(21) Appl. No.: 12/442,476

(22) PCT Filed: Feb. 19, 2008

(86) PCT No.: PCT/JP2008/052685
§ 371 (c)(1),
(2), (4) Date: Mar. 23, 2009

(87) PCT Pub. No.: WO2008/108160
PCT Pub. Date: Sep. 12, 2008

(65) Prior Publication Data
US 2009/0250374 A1    Oct. 8, 2009

(30) Foreign Application Priority Data
Mar. 5, 2007   (JP) ................................. 2007-053870

(51) Int. Cl.
*B65D 85/00* (2006.01)

(52) U.S. Cl. ........ 206/710; 206/832; 206/712; 206/713; 206/711; 206/454; 206/308.1; 206/480; 206/477; 211/41.18; 312/9.11

(58) Field of Classification Search .......... 206/710–713, 206/454, 832, 308.1, 707, 708, 445, 449, 206/455, 480, 477, 478; 211/41.18, 49.1, 211/40; 312/9.11
See application file for complete search history.

(56) References Cited

U.S. PATENT DOCUMENTS
3,454,154 A * 7/1969 Douglas et al. ............... 206/724
(Continued)

FOREIGN PATENT DOCUMENTS
| JP | 2002-222852 A | | 8/2002 |
| JP | 2004-022571 | | 1/2004 |
| JP | 2005-142443 A | | 6/2005 |
| JP | 2006-093274 A | | 4/2006 |
| JP | 2007329238 | * | 6/2007 |
| WO | 2005/006407 A1 | | 1/2005 |

OTHER PUBLICATIONS
English language Abstract of JP 2005-142443 A, Jun. 2, 2005.
(Continued)

*Primary Examiner* — J. Gregory Pickett
*Assistant Examiner* — Blaine Neway
(74) *Attorney, Agent, or Firm* — Greenblum & Bernstein, P.L.C.

(57) ABSTRACT

A wafer-retaining unit has a plurality of vertically superimposed single-wafer retaining sections, each having a wafer-retaining frame abutting against only a lower end edge portion of the outer periphery of a semiconductor wafer, a wafer-securing frame disposed vertically movably relative to the wafer-retaining frame to abut against only an upper end edge portion of the outer periphery of the semiconductor wafer, and wafer lift members that lift the semiconductor wafer to a position where it is upwardly separate from the wafer-retaining frame and keeps the semiconductor wafer in this position. Consequently, a plurality of semiconductor wafers can be accommodated efficiently and safely without increasing the space between each pair of mutually adjacent semiconductor wafers. At the same time, the semiconductor wafers can be loaded and unloaded satisfactorily.

20 Claims, 15 Drawing Sheets

U.S. PATENT DOCUMENTS

| | | | | |
|---|---|---|---|---|
| 3,552,548 | A | * | 1/1971 | Wallestad et al. ............. 206/710 |
| 5,314,068 | A | * | 5/1994 | Nakazato et al. ............. 206/454 |
| 5,445,271 | A | * | 8/1995 | Kakizaki et al. ........... 206/459.5 |
| 5,894,924 | A | * | 4/1999 | Koch ............................ 206/310 |
| 6,568,526 | B1 | * | 5/2003 | Reinhardt et al. ............ 206/310 |
| 6,837,374 | B2 | * | 1/2005 | Nigg et al. .................... 206/454 |
| 7,530,462 | B2 | * | 5/2009 | Yajima et al. ................ 206/710 |
| 2006/0151404 | A1 | | 7/2006 | Blattner et al. |

OTHER PUBLICATIONS

English language Abstract of JP 2006-093274 A, Apr. 6, 2006.
English language Abstract of JP 2002-222852 A, Aug. 9, 2002.
Japan Office action, mail date is Jun. 26, 2012.

\* cited by examiner

FIG. 9
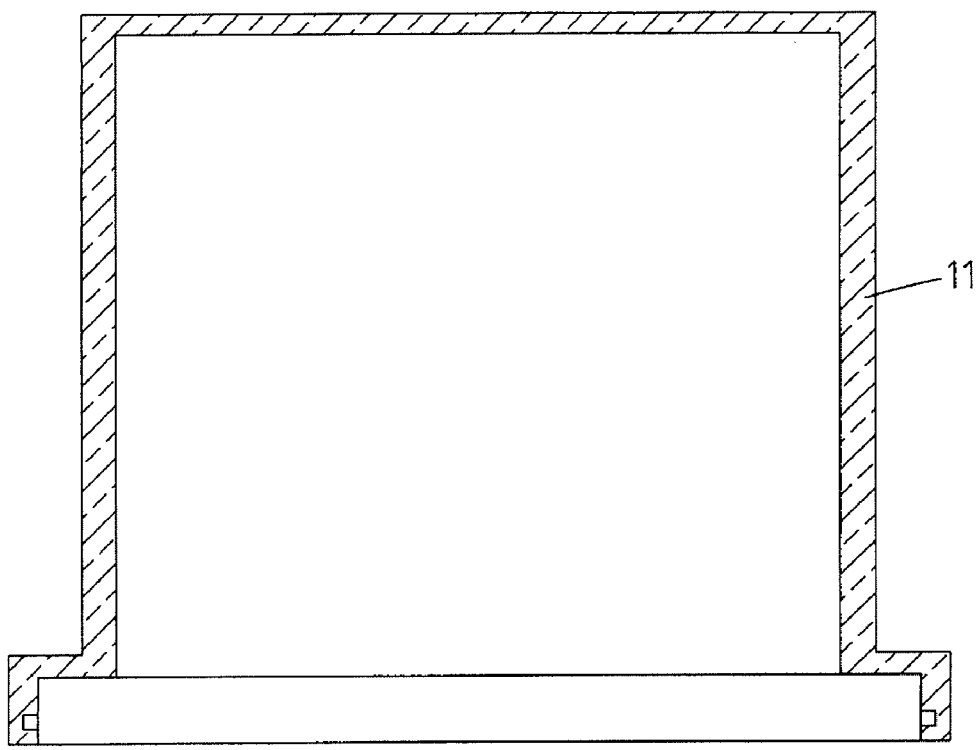
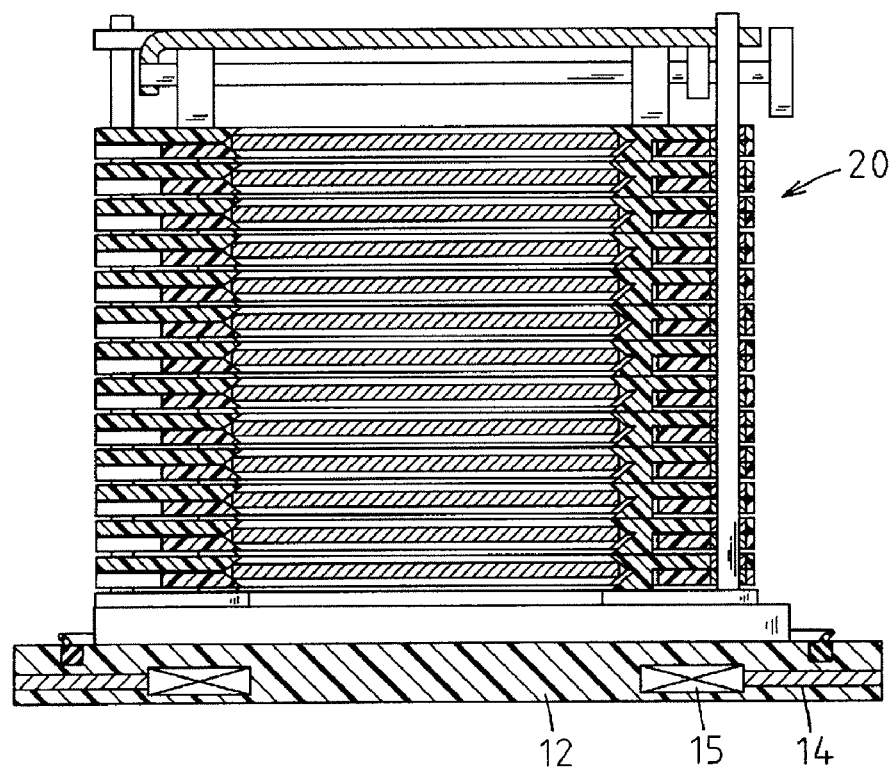

FIG.12
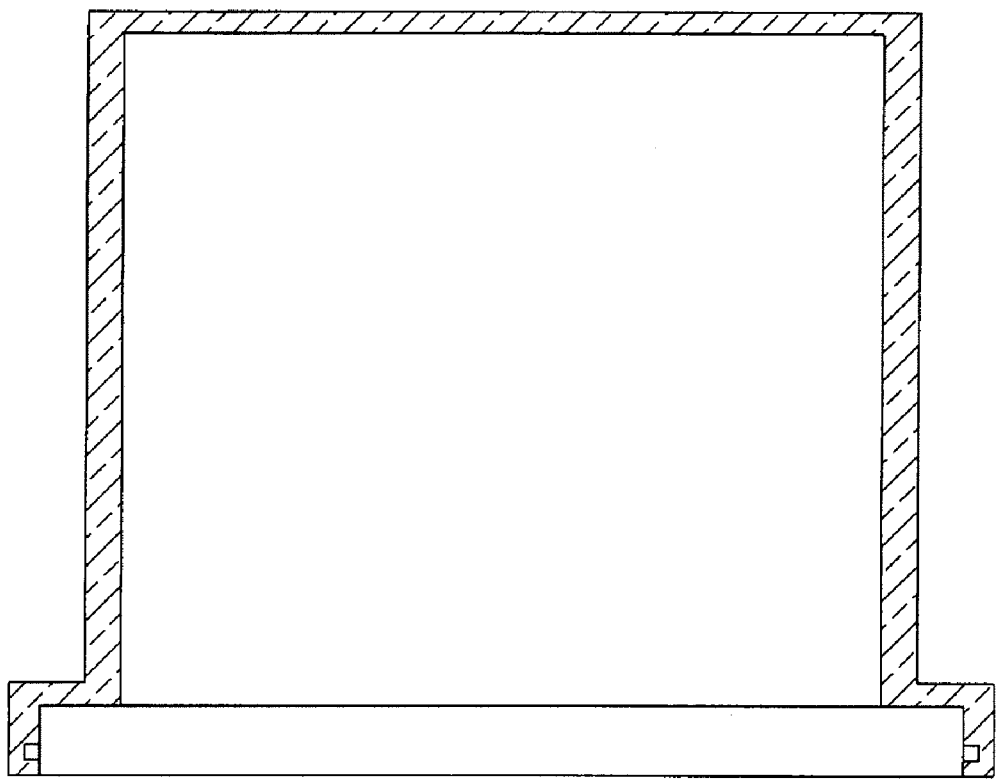
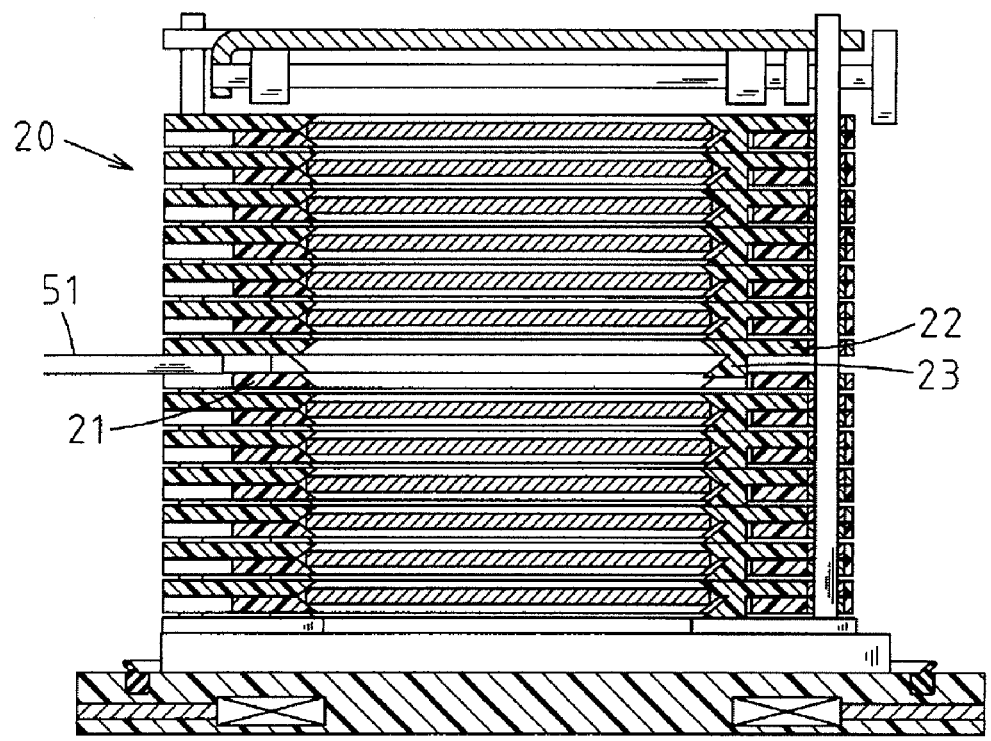

SEMICONDUCTOR WAFER CONTAINER

TECHNICAL FIELD

The present invention relates to a semiconductor wafer container for use to transport or store a plurality of semiconductor wafers accommodated in an environment isolated from the surroundings.

BACKGROUND ART

Many of such semiconductor wafer containers are arranged as follows. An openable and closable sealed container is provided therein with a wafer-retaining unit to retain a plurality of semiconductor wafers independently of and parallel to each other. Each semiconductor wafer is loaded into and unloaded from the wafer-retaining unit individually in a position where it lies horizontally (for example, see Patent Literatures 1 and 2).
Patent Literature 1: Japanese Patent Application Publication No. 2006-93274
Patent Literature 2: Japanese Patent Application Publication No. 2002-222852

DISCLOSURE OF INVENTION

Technical Problem

To retain a plurality of semiconductor wafers independently of and parallel to each other, a typical conventional semiconductor wafer container has a plurality of parallel grooves (or slots) to receive and retain each individual semiconductor wafer at several portions of the outer edge thereof.

To unload semiconductor wafers from the semiconductor wafer container, the semiconductor wafers retained horizontally and vertically spaced from each other are transferred one by one, being placed on a robot hand, which is automatically operated.

In this regard, however, as the diameter of semiconductor wafers increases from 300 mm to 450 mm or more, each semiconductor wafer that is retained only at the outer edge thereof is downwardly warped at its central part by gravity. Therefore, the space between each pair of mutually adjacent semiconductor wafers needs to be increased in order to place a semiconductor wafer onto the robot hand safely. Accordingly, the semiconductor wafer container increases in size not only in the radial direction but also in the axial direction of the semiconductor wafer, resulting in a degradation of space efficiency.

An object of the present invention is to provide a semiconductor wafer container that is capable of accommodating a plurality of semiconductor wafers efficiently and safely without increasing the space between each pair of mutually adjacent semiconductor wafers even when the diameter of semiconductor wafers increases, and that, at the same time, allows semiconductor wafers to be loaded and unloaded satisfactorily.

Solution to Problem

To attain the above-described object, the present invention provides a semiconductor wafer container including an openable and closable sealed container and a wafer-retaining unit provided in the sealed container to retain a plurality of semiconductor wafers independently of and parallel to each other. The plurality of semiconductor wafers are each placed horizontally at least when they are to be loaded into or unloaded from the wafer-retaining unit. The wafer-retaining unit has a plurality of vertically superimposed single-wafer retaining sections. Each single-wafer retaining section has a wafer-retaining frame retaining a single semiconductor wafer horizontally placed thereon by abutting against only a lower end edge portion of the outer periphery of the semiconductor wafer, and a wafer-securing frame disposed vertically movably relative to the wafer-retaining frame. The wafer-securing frame abuts against only an upper end edge portion of the outer periphery of the semiconductor wafer retained by the wafer-retaining frame, thereby holding the semiconductor wafer between the wafer-retaining frame and the wafer-securing frame. Each single-wafer retaining section further has a wafer lift member disposed underneath the semiconductor wafer held between the wafer-retaining frame and the wafer-securing frame. The wafer lift member moves upward when the wafer-securing frame retracts upward relative to the wafer-retaining frame, thereby lifting up the semiconductor wafer to a position where the semiconductor wafer is upwardly separate from the wafer-retaining frame, and keeping the semiconductor wafer in this position.

The wafer-retaining frame may be an annular frame member having a slant surface that abuts against the lower end edge portion of the semiconductor wafer from obliquely below. The wafer-securing frame may be an annular frame member having a slant surface that abuts against the upper end edge portion of the semiconductor wafer from obliquely above. In this case, the slant surface of the wafer-retaining frame and the slant surface of the wafer-securing frame may form in combination a V-shaped sectional shape that abuts against the upper and lower end edge portions of the outer periphery of the semiconductor wafer.

The wafer-retaining frame may be integrally connected to a wafer-securing frame of a single-wafer retaining section downwardly adjacent to the single-wafer retaining section to which the wafer-retaining frame belongs. The wafer-retaining frame may retain the semiconductor wafer at a plurality of circumferentially spaced positions, and the wafer lift member may lift up the semiconductor wafer at portions of the outer edge of the semiconductor wafer that are not retained by the wafer-retaining frame.

The wafer-retaining frame may retain the semiconductor wafer at the entire circumference of the semiconductor wafer, and the wafer lift member may lift up the semiconductor wafer at a position radially inward of the position at which the semiconductor wafer is retained by the wafer-retaining frame. The wafer lift member may be arranged to lift up the semiconductor wafer at a plurality of dispersed positions near the peripheral edge of the semiconductor wafer. The wafer lift member may be integrally connected to the wafer-securing frame.

The wafer lift member may be driven by a wafer lift driving means provided outside the wafer-retaining unit. In this case, the wafer lift member may translate parallel to a vertical direction. Alternatively, the wafer lift member may pivot about a pivot. The wafer lift member may be formed of an elastic material to urge the semiconductor wafer upward from below.

The plurality of single-wafer retaining sections may be individually retained by a plurality of upright guide posts and vertically slidable along the guide posts. In this case, the space between at least two of the plurality of guide posts may be larger than the diameter of the semiconductor wafer, so that the semiconductor wafer can be loaded into and unloaded from the wafer-retaining unit through the space between the two guide posts.

There may be provided a clamp mechanism capable of switching between an unlock position where all vertically superimposed single-wafer retaining sections retained by the guide posts are movable along the guide posts and a lock position where all the single-wafer retaining sections are not movable along the guide posts. The clamp mechanism may have a horizontally disposed rotary connecting shaft and an eccentric roller mounted on the rotary connecting shaft, so that all the single-wafer retaining sections can be brought into the lock position by pressing the outer peripheral surface of the eccentric roller against the upper end frame surface of the wafer-retaining unit. The clamp mechanism may be provided with a connecting part for connecting a clamp mechanism driving means provided outside the wafer-retaining unit to the rotary connecting shaft of the clamp mechanism.

The arrangement may be such that any wafer-securing frame in the wafer-retaining unit can be moved upward, together with all single-wafer retaining sections above the wafer-securing frame, by a securing frame lifting means provided outside the wafer-retaining unit.

The arrangement may be as follows. The sealed container has a container body having an opening in the bottom thereof, a cover detachably attached to the opening, and a seal member that seals the gap between the container body and the cover, and the guide posts are stood on the cover. Alternatively, the arrangement may be as follows. The sealed container has a container body having an opening in a side thereof, a cover detachably attached to the opening, and a seal member that seals the gap between the container body and the cover, and the guide posts are stood in the container body.

Advantageous Effects of Invention

According to the present invention, a wafer lift member is provided underneath a semiconductor wafer held between a wafer-retaining frame and a wafer-securing frame. The wafer lift member moves upward when the wafer-securing frame retracts upward relative to the wafer-retaining frame, thereby lifting up the semiconductor wafer to a position where the semiconductor wafer is upwardly separate from the wafer-retaining frame, and keeping the semiconductor wafer in this position. Consequently, even when the diameter of the semiconductor wafer increases so that the semiconductor wafer is warped by gravity when it is loaded or unloaded, the semiconductor wafer can be loaded or unloaded satisfactorily by enlarging only the space between the semiconductor wafer to be loaded or unloaded and a semiconductor wafer located underneath it. Further, a plurality of semiconductor wafers can be accommodated efficiently and safely without increasing the space between each pair of mutually adjacent semiconductor wafers.

BRIEF DESCRIPTION OF DRAWINGS

FIG. 9 is a sectional front view of the semiconductor wafer container according to the first embodiment of the present invention, showing a state where the container body has been removed therefrom.

FIG. 12 is a sectional front view of the semiconductor wafer container according to the first embodiment of the present invention, showing a state where the unloading of the semiconductor wafer has been completed.

REFERENCE SIGNS LIST

Figure 1:
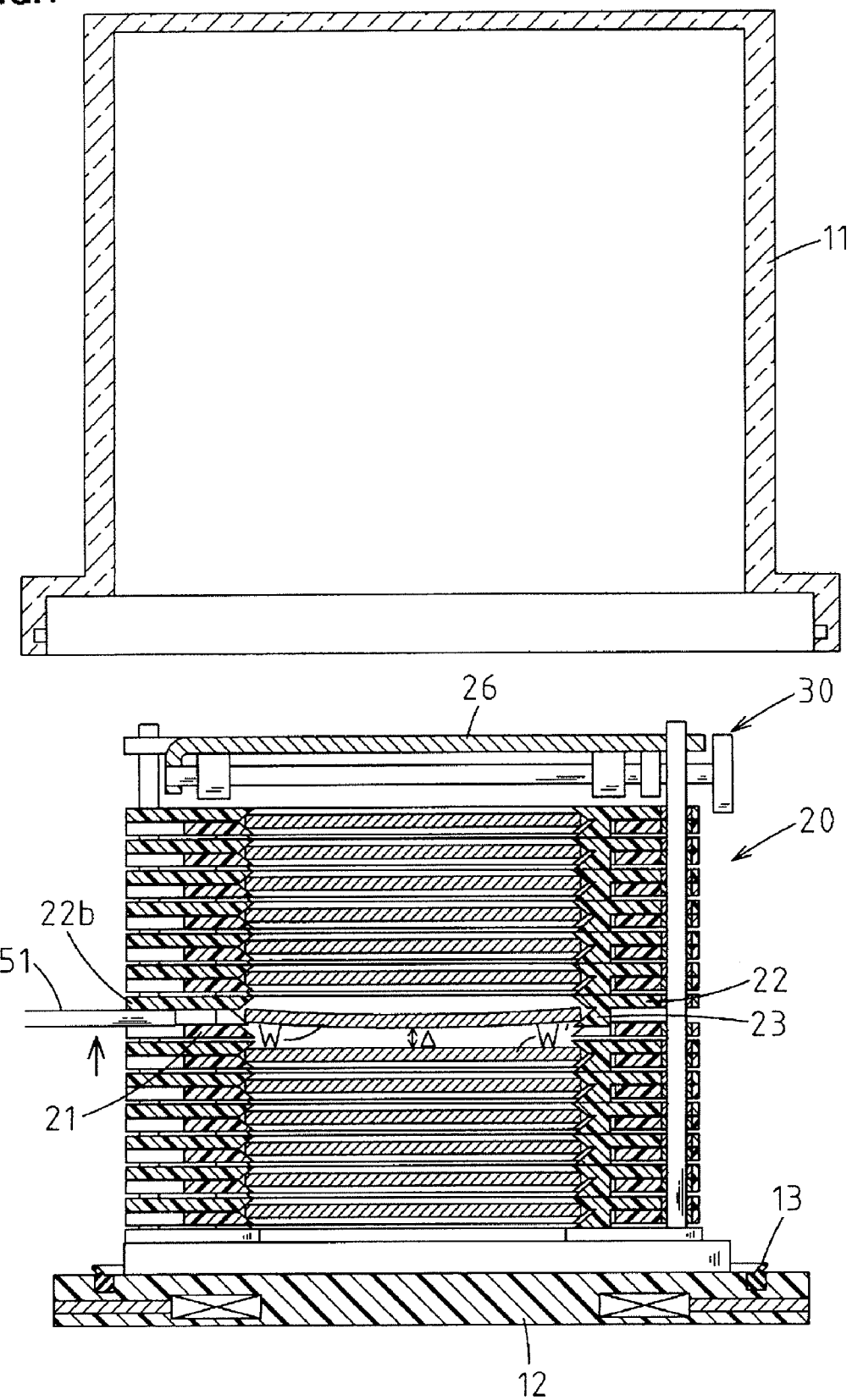
FIG. 1 is a sectional front view of a semiconductor wafer container according to a first embodiment of the present invention, showing a state where a wafer-securing frame has retracted upward and a semiconductor wafer is retained by wafer lift members.

10: sealed container
11: container body
12: cover
13: seal member
20: wafer-retaining unit
21: wafer-retaining frame
21a: slant surface
22: wafer-securing frame
22a: slant surface
23: wafer lift member
25: guide post
30: clamp mechanism
31: rotary connecting shaft
32: eccentric roller
34: connecting hole (connecting part)
51: lifting arm (securing frame lifting means)
61: robot hand
71: clamp driving arm (clamp mechanism driving means)
W: semiconductor wafer

BEST MODE FOR CARRYING OUT THE INVENTION

Embodiments of the present invention will be explained below with reference to the accompanying drawings.

Figure 2:
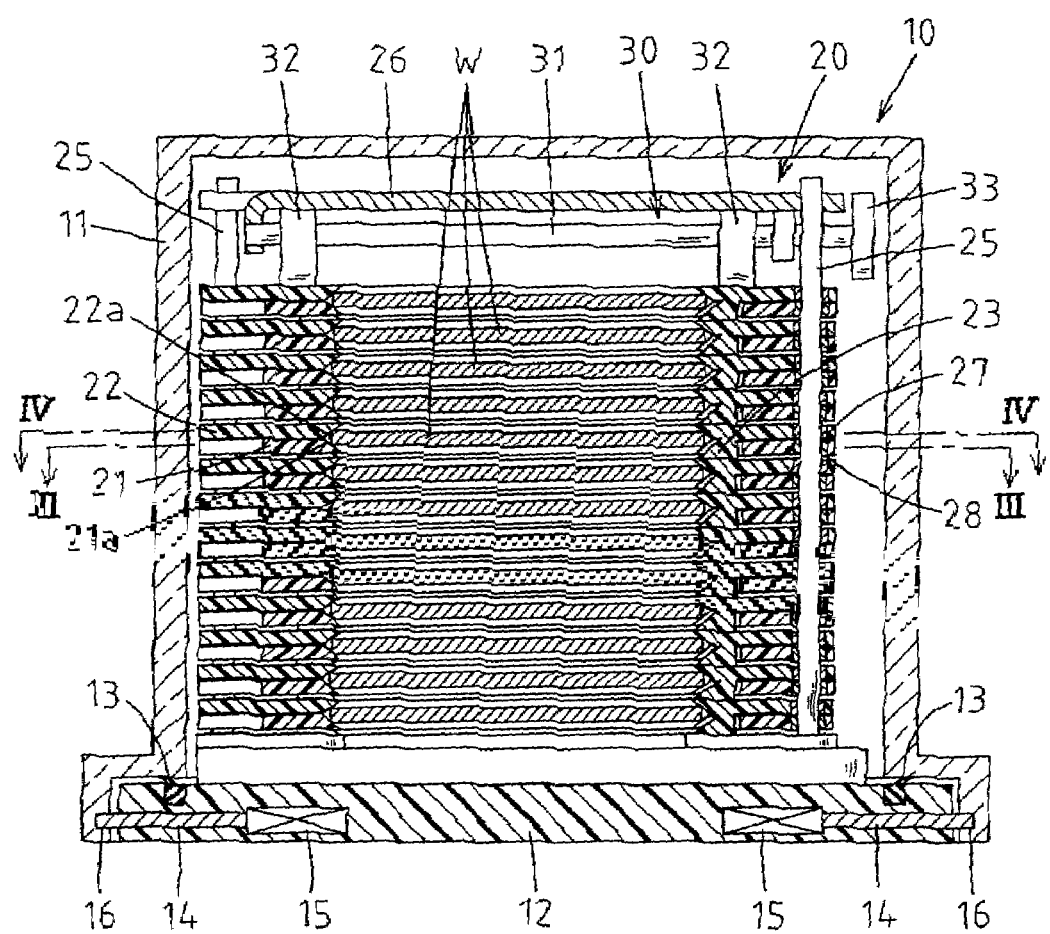
FIG. 2 is a sectional front view of the semiconductor wafer container according to the first embodiment of the present invention, showing the way in which semiconductor wafers are accommodated in the semiconductor wafer container.

FIG. 2 shows a semiconductor wafer container according to a first embodiment of the present invention. A sealed container 10 has a wafer-retaining unit 20 disposed therein to retain a plurality of semiconductor wafers W independently of and parallel to each other. It should be noted that FIG. 2 illustrates a plurality of different sections so that the structures of various parts are shown in a single drawing.

The sealed container 10 has a container body 11 made of a polycarbonate resin, for example. The container body 11 is closed at all sides thereof except the bottom. A cover 12 is detachably attached to an opening in the bottom of the container body 11. Thus, the opening of the container body 11 can be opened and closed as desired. The cover 12 has an annular seal member 13 fitted thereto to seal the gap between the container body 11 and the cover 12. The seal member 13 is made of an elastic material. Reference numeral 14 denotes lock members provided on the cover 12 so that each lock member 14 is longitudinally advanced and retracted by a known latch driving mechanism 15. Each lock member 14 has its distal end portion inserted into a latch hole 16 formed in the container body 11 to lock the cover 12 to the container body 11 so that the cover 12 cannot separate from the container body 11.

The wafer-retaining unit 20 is supported by four guide posts 25 stood from the cover 12 to extend vertically in the space in the container body 11. Reference numeral 26 denotes a top frame that connects together the upper ends of the four guide posts 25. The wafer-retaining unit 20 has a plurality of vertically superimposed single-wafer retaining sections, each comprising a wafer-retaining frame 21, a wafer-securing frame 22 and wafer lift members 23. The wafer-retaining frame 21 retains a single semiconductor wafer W placed thereon. The wafer-securing frame 22 secures the semiconductor wafer W in the state of being held between the wafer-retaining frame 21 and the wafer-securing frame 22. The wafer lift members 23 are used to lift up the semiconductor wafer W to a position where the semiconductor wafer W is upwardly separate from the wafer-retaining frame 21.

The wafer-retaining frame 21 is an annular frame member having a slant surface 21a that abuts against a lower end edge portion of the semiconductor wafer W from obliquely below. The wafer-securing frame 22 is an annular frame member having a slant surface 22a that abuts against an upper end edge portion of the semiconductor wafer W from obliquely above. The slant surface 21a of the wafer-retaining frame 21 and the slant surface 22a of the wafer-securing frame 22 form in combination a V-shaped sectional shape that abuts against the upper and lower end edge portions of the outer periphery of the semiconductor wafer W. It should be noted that the semiconductor wafer W is an ultra-thin silicon disk having a diameter of 300 mm or 450 mm, for example, and a thickness of about 1 mm or less, for example. In the figures, however, the thickness of the semiconductor wafer W is shown exaggeratedly.

Figure 3:
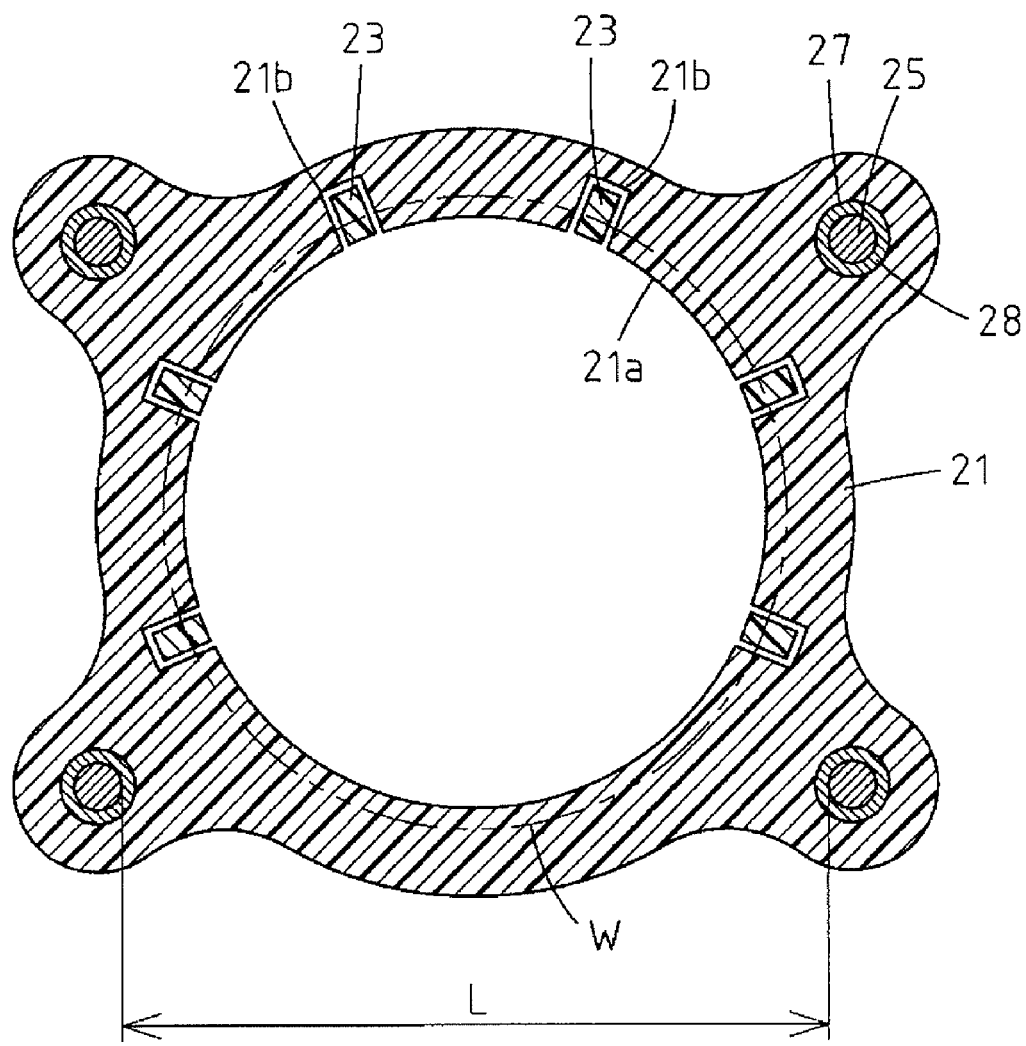
FIG. 3 is a sectional view of the semiconductor wafer container according to the first embodiment of the present invention, taken along the line III-III in FIG. 2.

As shown in FIG. 3 (the semiconductor wafer W is not shown), which is a III-III sectional view, the wafer-retaining frame 21 has projecting portions projecting outward from four positions of the outer periphery thereof. The projecting portions are provided with respective holes 27 through which the guide posts 25 pass, respectively. Each hole 27 is fitted with a cylindrical slide bearing 28 made of a material offering a small frictional resistance to the associated guide post 25, for example, a fluorocarbon resin material. Consequently, the wafer-retaining frame 21 can slide smoothly along the guide posts 25.

The inner periphery of the wafer-retaining frame 21, where the slant surface 21a is formed, has cut portions 21b at six positions spaced from each other by 45°, for example. The wafer lift members 23 are loosely fitted in the cut portions 21b, respectively. It should be noted that the wafer lift members 23 only need to be arranged to lift up the semiconductor wafer W at a plurality of dispersed positions along the peripheral edge of the wafer W. In addition, as shown in FIG. 3, the distance L between at least two of the guide posts 25 is set larger than the diameter of the semiconductor wafer W. Consequently, the semiconductor wafer W can be loaded into and unloaded from the wafer-retaining unit 20 through the space between the two guide posts 25.

Figure 4:
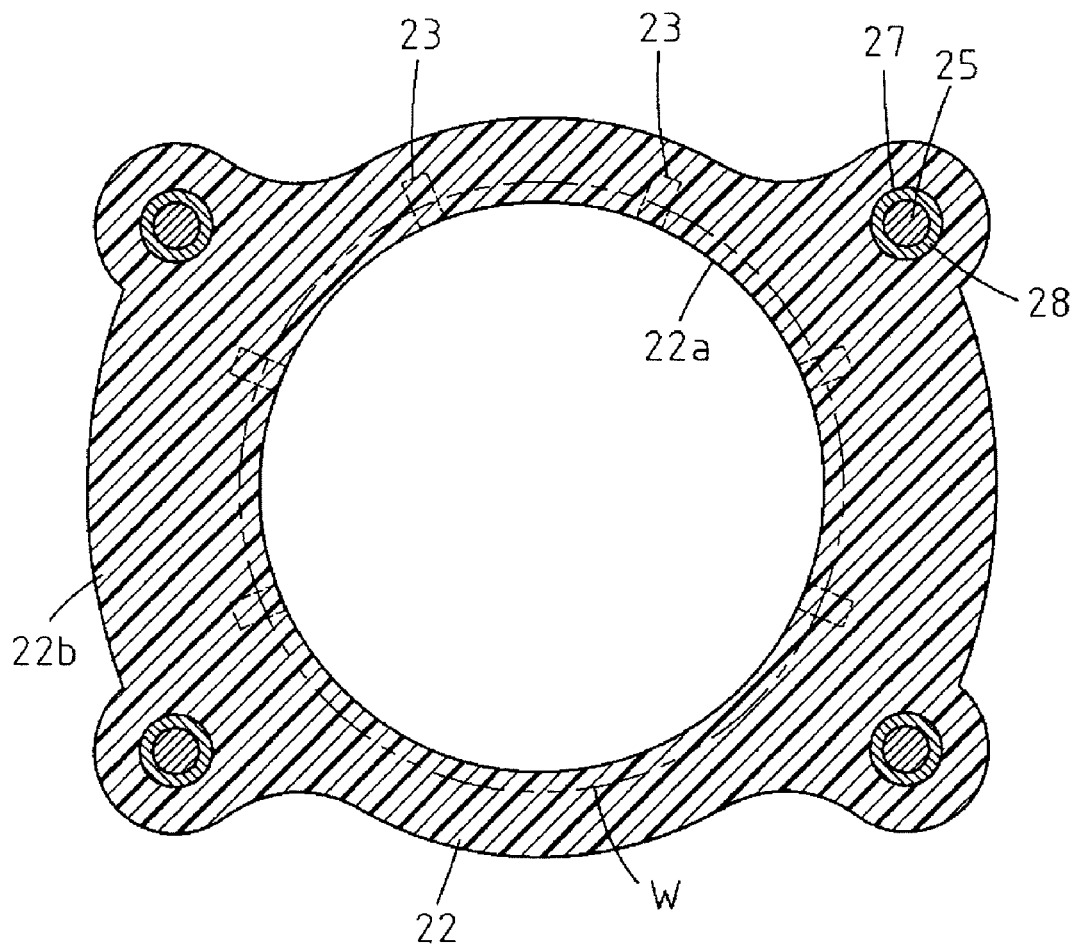
FIG. 4 is a sectional view of the semiconductor wafer container according to the first embodiment of the present invention, taken along the line IV-IV in FIG. 2.

As shown in FIG. 4 (the semiconductor wafer W is not shown), which shows a IV-IV section in FIG. 2, the wafer-securing frame 22 has slide bearings 28 (similar to those in the wafer-retaining frame 21) fitted in four holes 27 through which the guide posts 25 pass, respectively. Thus, the wafer-securing frame 22 is disposed vertically movably relative to the wafer-retaining frame 21. The wafer-securing frame 22 has brims 22b projecting outward beyond the wafer-retaining frame 21. The brims 22b are formed at positions through which the semiconductor wafer W is not loaded into and unloaded from the wafer-retaining unit 20. The wafer-securing frame 22 can be lifted up at the brims 22b by a lifting arm (securing frame lifting means) 51 (described later). In this embodiment, the wafer lift members 23 are integrally connected to the wafer-securing frame 22 at the inner periphery of the latter, where the slant surface 22a is formed.

The wafer lift members 23 each have, as shown in FIG. 2, a slant surface formed at a position slightly below the slant surface 21a of the wafer-retaining frame 21 so that the slant surface does not normally contact the semiconductor wafer W. The slant surface is disposed underneath the lower side of the semiconductor wafer W as held between the wafer-retaining frame 21 and the wafer-securing frame 22 (i.e. directly below the slant surface 21a of the wafer-retaining frame 21).

It should be noted that the wafer-retaining frame 21, the wafer-securing frame 22 and the wafer lift members 23 should preferably be formed of an electrically conductive resin or the like to prevent generation of static electricity, which attracts dust or the like.

Figure 5:
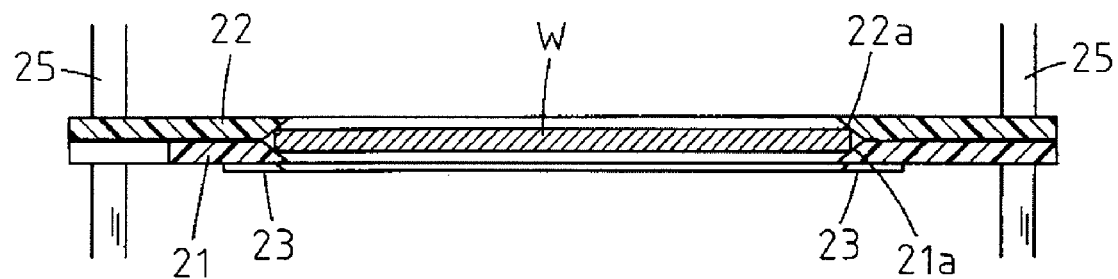
FIG. 5 is a sectional front view of a single-wafer retaining section in the semiconductor wafer container according to the first embodiment of the present invention.

FIG. 5 shows one of the single-wafer retaining sections (21 to 23) arranged as stated above. The slant surface 21a of the wafer-retaining frame 21 abuts against only a lower end edge portion of the outer periphery of a single horizontally placed semiconductor wafer W at substantially the entire circumference thereof except the cut portions 21b, thereby retaining the semiconductor wafer W. The slant surface 22a of the wafer-securing frame 22 abuts against only an upper end edge portion of the outer periphery of the semiconductor wafer W, which is retained by the wafer-retaining frame 21, at the entire circumference thereof, thereby holding the semiconductor wafer W between the wafer-retaining frame 21 and the wafer-securing frame 22. As a result, the semiconductor wafer W can be secured with a minimum warp. The wafer lift members 23 are not in contact with the semiconductor wafer W.

Figure 6:
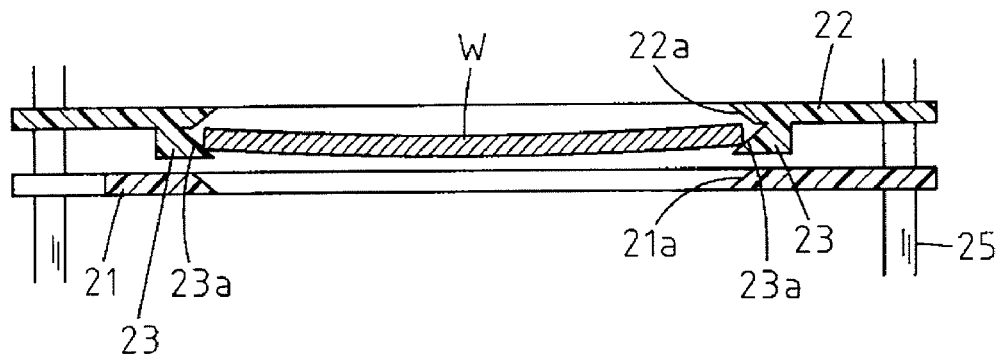
FIG. 6 is a sectional front view of a single-wafer retaining section in the semiconductor wafer container according to the first embodiment of the present invention.

The single-wafer retaining sections (21 to 23) are vertically slidable along the four guide posts 25, which retain them. When the wafer-securing frame 22 is upwardly retracted from the wafer-retaining frame 21 as shown in FIG. 6, the wafer lift members 23 move upward together with the wafer-securing frame 22. Consequently, the semiconductor wafer W is lifted up by the wafer lift members 23 at six positions, for example, of the outer edge thereof that are not placed on the wafer-retaining frame 21. Thus, the semiconductor wafer W is separated upward from the slant surface 21a of the wafer-retaining frame 21 and kept retained on the wafer lift members 23.

Figure 7:
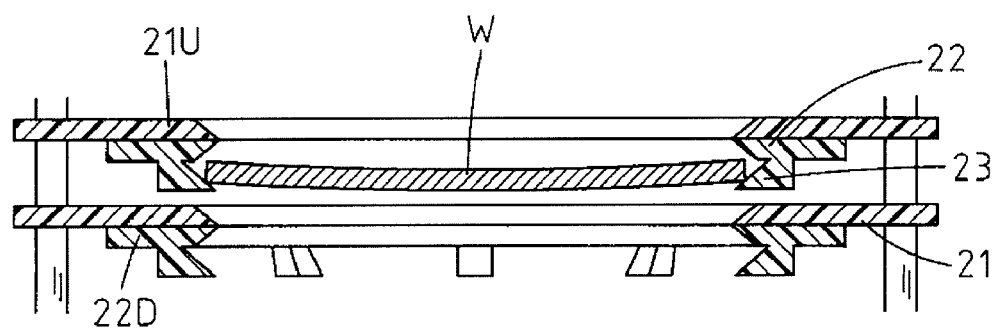
FIG. 7 is a sectional front view showing an operative state of the semiconductor wafer container according to the first embodiment of the present invention in a case where a wafer-retaining frame of each single-wafer retaining section is integrally connected to a wafer-securing frame of a single-wafer retaining section downwardly adjacent to the single-wafer retaining section to which the wafer-retaining frame belongs.

It should be noted that the wafer-retaining frame 21 may be, as shown in FIG. 7, integrally connected to a wafer-securing frame 22D of a single-wafer retaining section (21 to 23) downwardly adjacent to the single-wafer retaining section to which the wafer-retaining frame 21 belongs. By so doing, the structures of the wafer-retaining frame 21 and the wafer-securing frame 22 can be simplified. In this case, the wafer-securing frame 22 of the single-wafer retaining section (21 to 23) to which the wafer-retaining frame 21 belongs is integrally connected to a wafer-retaining frame 21U of a single-wafer retaining section upwardly adjacent thereto.

Referring back to FIG. 2, a clamp mechanism 30 is provided near the upper end of the wafer-retaining unit 20. The clamp mechanism 30 can switch between an unlock position where all the vertically superimposed single-wafer retaining sections (21 to 23) retained by the guide posts 25 are movable along the guide posts 25 and a lock position where all the vertically superimposed single-wafer retaining sections (21 to 23) are not movable along the guide posts 25.

Figure 8:
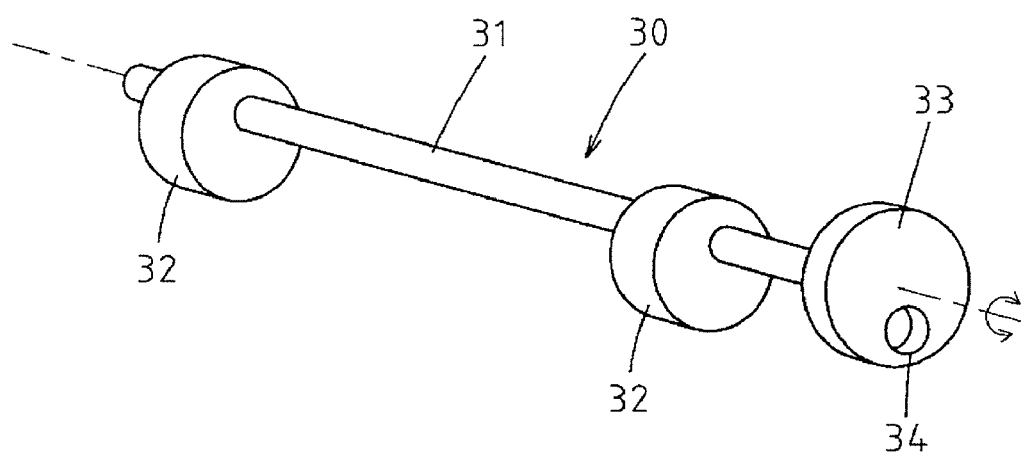
FIG. 8 is a perspective view showing a clamp mechanism as a single unit that is used in the semiconductor wafer container according to the first embodiment of the present invention.

The clamp mechanism 30 has, as shown in FIG. 8 being a single unit, a rotary connecting shaft 31 horizontally disposed and rotatably supported by the top frame 26. The clamp mechanism 30 further has a pair of eccentric rollers 32 mounted on the rotary connecting shaft 31 and a driving wheel 33 mounted on the outer end of the rotary connecting shaft 31. Reference numeral 34 denotes a connecting hole (connecting part) for connecting a clamp mechanism driving means (described later) provided outside the wafer-retaining unit 20.

The outer peripheral surfaces of the pair of eccentric rollers 32 are pressed against the upper end frame surface of the wafer-retaining unit 20, whereby all the single-wafer retaining sections (21 to 23) are placed in the lock position where they cannot move relative to the guide posts 25. It should be noted that the term "the upper end frame surface of the wafer-retaining unit 20" as used in this embodiment means the upper end surface of a wafer-securing frame 22 located at the upper end. However, in a case where the wafer-securing frame 22 at the upper end is omitted, "the upper end frame surface of the wafer-retaining unit 20" may be the upper end surface of a wafer-retaining frame 21. If a ceiling frame or the like is provided at the upper end of the superimposed frames 21 and 22, "the upper end frame surface of the wafer-retaining unit 20" means the upper end surface of the ceiling frame (the same shall apply hereinafter).

As the driving wheel 33 is driven to rotate, the eccentric rollers 32 rotate through the rotary connecting shaft 31. When the small-radius portion of each eccentric roller 32 (i.e. a portion of the eccentric roller 32 having a shorter distance from the axis position of the rotary connecting shaft 31 to the outer peripheral surface of the eccentric roller 32 than the rest) comes to face the upper end frame surface of the wafer-retaining unit 20, a gap is created between the outer peripheral surface of each eccentric roller 32 and the wafer-securing frame 22 at the upper end position. Consequently, all the single-wafer retaining sections (21 to 23) become vertically slidable relative to the guide posts 25. It should be noted that each eccentric roller 32 may have any configuration, e.g. an elliptic or other configuration, provided that the distance from the center axis to the outer peripheral surface of the eccentric roller 32 changes as the rotary connecting shaft 31 rotates. The concept of the eccentric rollers 32 in the present invention includes all such configurations.

The following is an explanation of an operation performed when a semiconductor wafer W is unloaded from the semiconductor wafer container of the above-described embodiment. When in the accommodated state shown in FIG. 2, semiconductor wafers W may be placed in any orientation besides a horizontal orientation. At the time of performing an unloading operation, however, the sealed container 10 is always set in such an orientation that the semiconductor wafers W lie horizontally.

Figure 10:
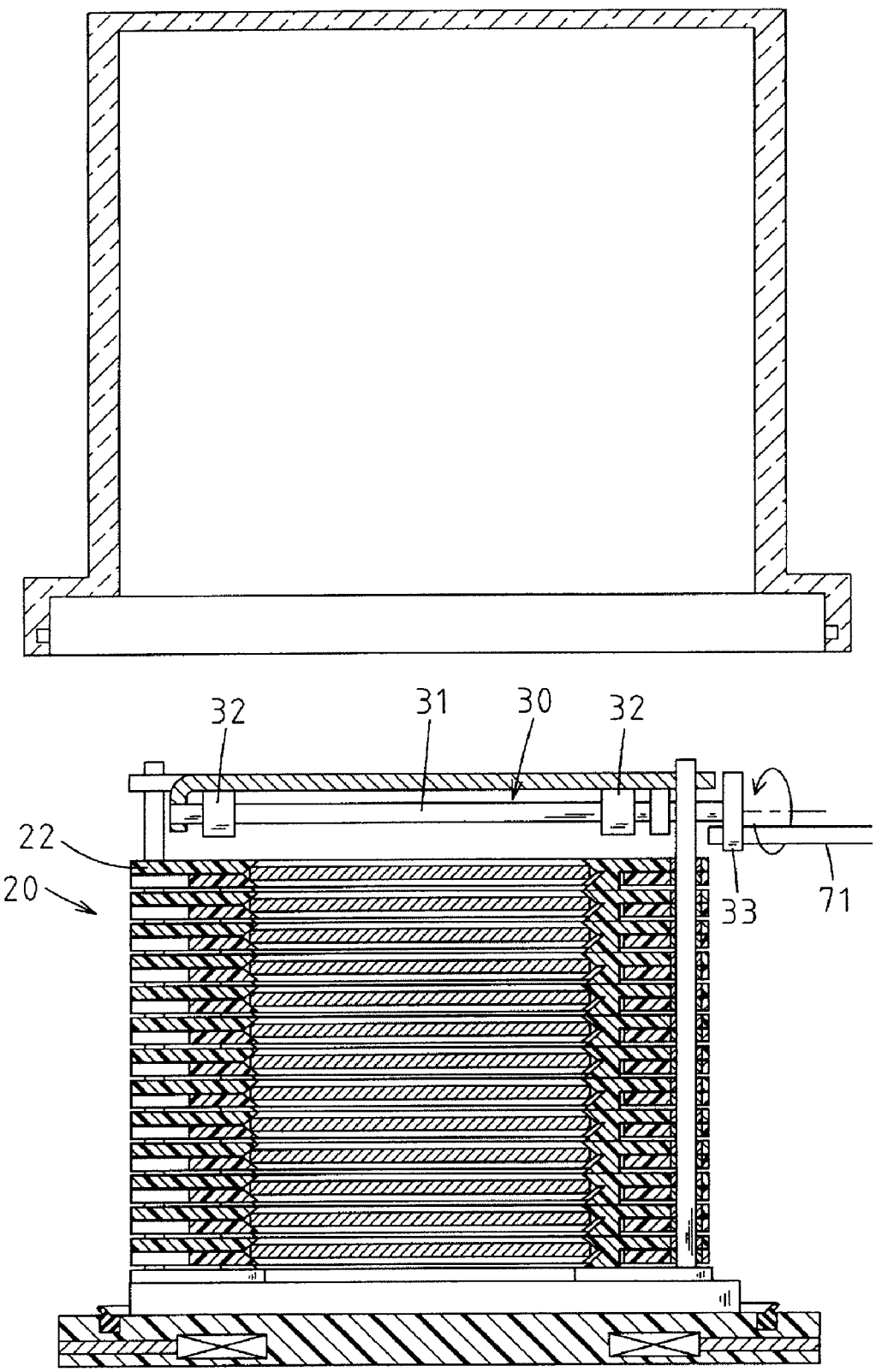
FIG. 10 is a sectional front view of the semiconductor wafer container according to the first embodiment of the present invention, showing a state where the clamp mechanism is in an unlock (retracted) position.

To unload a semiconductor wafer W, first, as shown in FIG. 9, the latch driving mechanisms 15 are actuated to withdraw the distal ends of the lock members 14 to separate the container body 11 and the cover 12 from each other. Next, as shown in FIG. 10, a clamp driving arm (clamp mechanism driving means) 71 provided outside the wafer-retaining unit 20 is actuated to rotationally drive the driving wheel 33 of the clamp mechanism 30, thus retracting the eccentric rollers 32 to respective positions upwardly away from the upper end frame surface of the wafer-retaining unit 20.

Subsequently, as shown in FIG. 1, a lifting arm 51 (securing frame lifting means) provided outside the wafer-retaining unit 20 is inserted under the brims 22b of the wafer-securing frame 22 securing the semiconductor wafer W to be unloaded to retract the wafer-securing frame 22 upward. Consequently, all the single-wafer retaining sections (21 to 23) above this position move upward. At the same time, the wafer-securing frame 22 securing the semiconductor wafer W to be unloaded retracts upward relative to the wafer-retaining frame 21 on which the semiconductor wafer W is placed.

Thereupon, the wafer lift members 23, which are integrally formed with the wafer-securing frame 22, move upward. Consequently, the semiconductor wafer W separates from the wafer-retaining frame 21, being retained only by the wafer lift members 23. Thus, the semiconductor wafer W is released from being held at the outer edge portion thereof and becomes warped in a downward convex shape by gravity as shown in FIG. 1.

Figure 11:
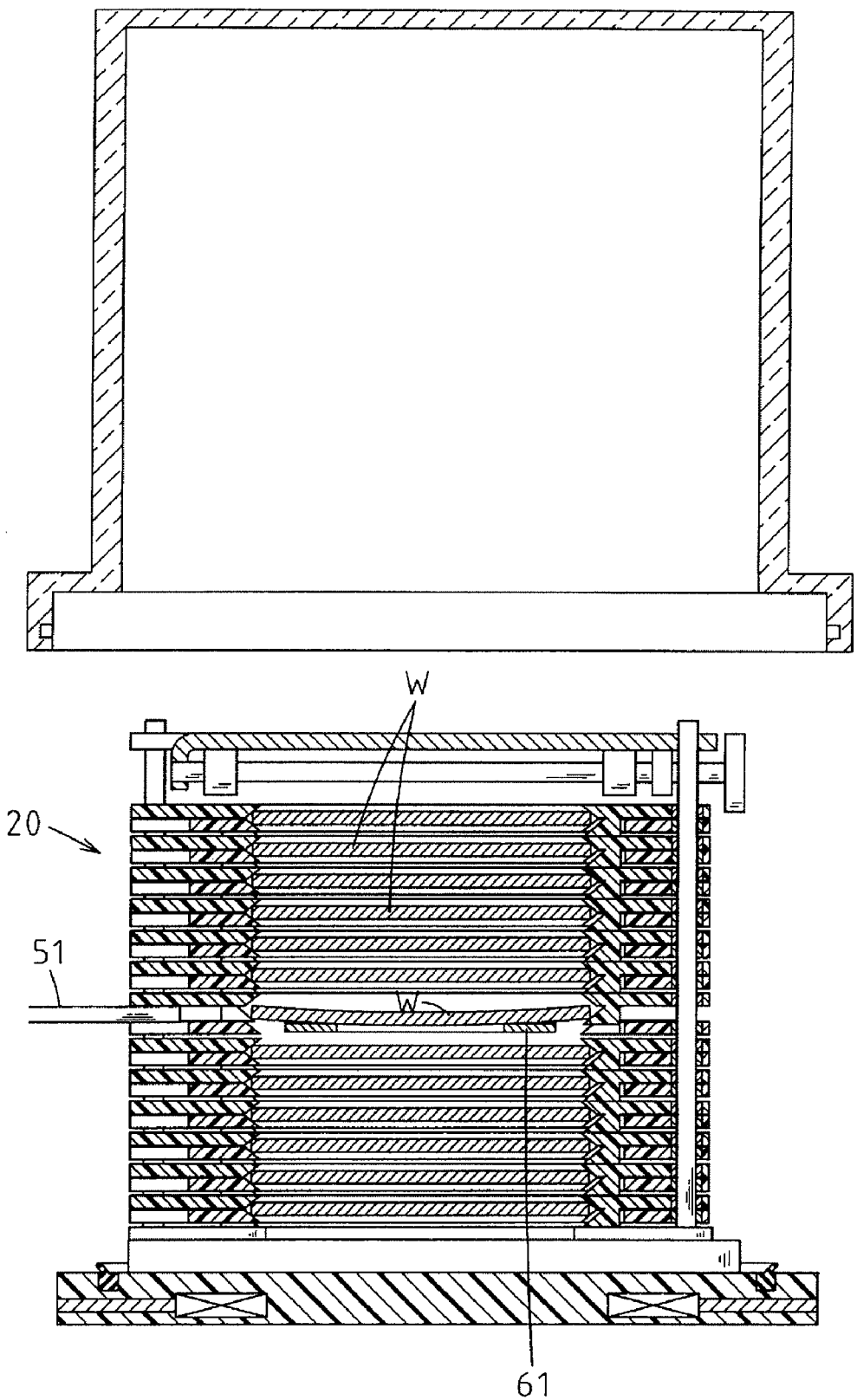
FIG. 11 is a sectional front view of the semiconductor wafer container according to the first embodiment of the present invention, showing a state where a semiconductor wafer is being unloaded from the semiconductor wafer container.

In the present invention, however, the semiconductor wafer W has moved to a position above the original position where it was held. Therefore, an enlarged gap Δ is formed between the semiconductor wafer W and a semiconductor wafer W' downwardly adjacent thereto. Accordingly, even if the semiconductor wafer W is warped downward, it will not contact the semiconductor wafer W' downwardly adjacent thereto, and a gap is ensured therebetween as shown in FIG. 11, which is large enough for a robot hand 61 provided outside the wafer-retaining unit 20 to be inserted under the semiconductor wafer W. Thus, the semiconductor wafer W can be placed onto the robot hand 61 surely and safely and moved in a slightly raised position so as not to contact the wafer lift members 23. In this way, the semiconductor wafer W can be taken out of the wafer-retaining unit 20.

Figure 13:
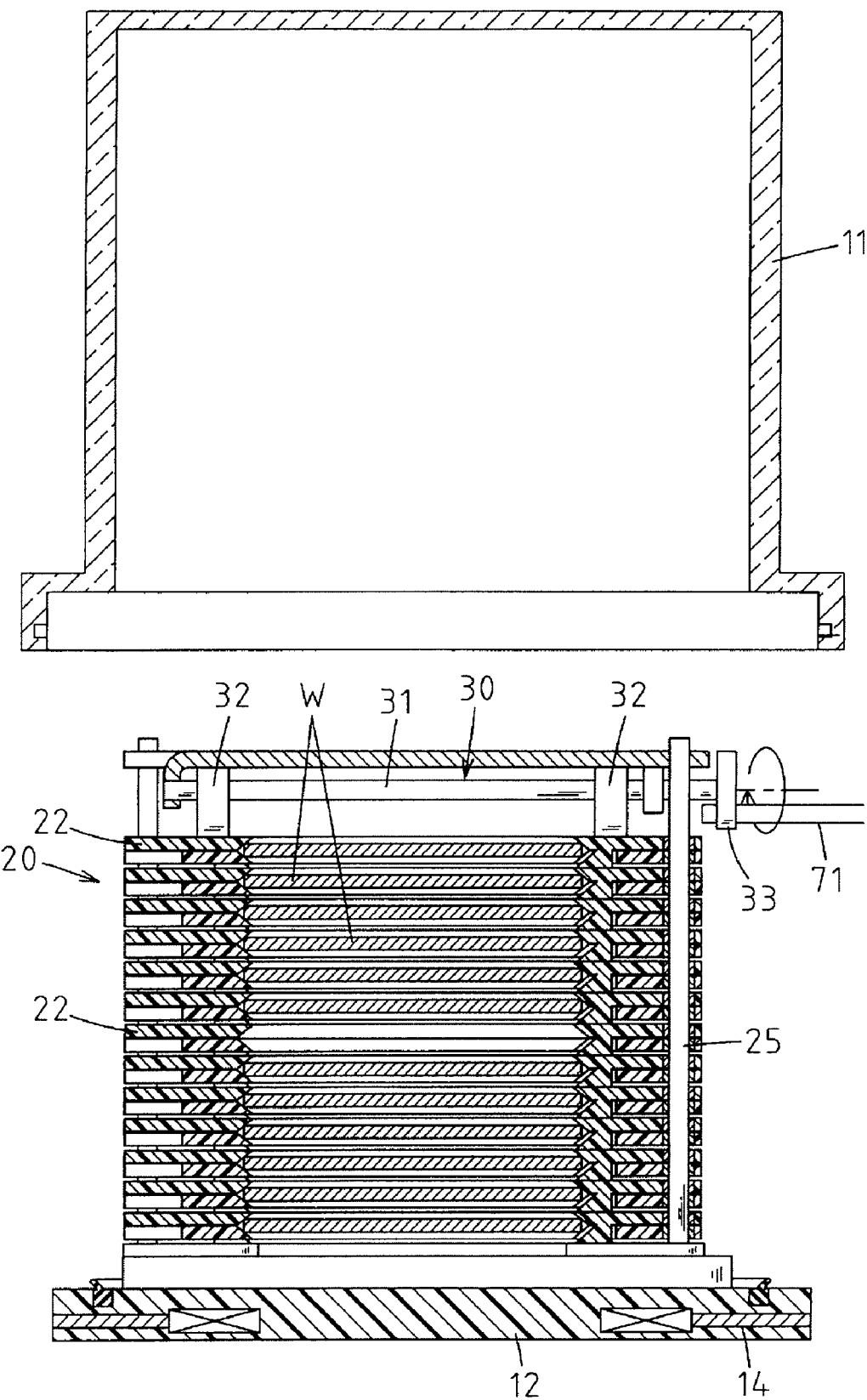
FIG. 13 is a sectional front view of the semiconductor wafer container according to the first embodiment of the present invention, showing a state where the clamp mechanism is placed in a lock position again.

Upon the completion of unloading the desired semiconductor wafer W as shown in FIG. 12, the wafer-securing frame 22 moved upward by the lifting arm (securing frame lifting means) 51 (together with all the single-wafer retaining sections 21 to 23 above the wafer-securing frame 22) is returned to the previous position as shown in FIG. 13, and the driving wheel 33 of the clamp mechanism 30 is rotationally driven to press the eccentric rollers 32 against the upper end frame surface of the wafer-retaining unit 20, thereby allowing all the single-wafer retaining sections (21 to 23) to return to the lock position. Finally, the opening at the lower end of the container body 11 is engaged with the cover 12, and the cover 12 is locked to the container body 11 by the lock members 14, thereby placing the semiconductor wafers W in an accommodated state.

It should be noted that if the structure shown in FIG. 7 is adopted, in which a wafer-securing frame 22 is integrally formed with a wafer-retaining frame 21U upwardly adjacent thereto, the wafer-retaining frame 21U is moved upward by the lifting arm (securing frame lifting means) 51 instead of retracting the wafer-securing frame 22 upward during the operation shown in FIG. 1.

Figure 14:
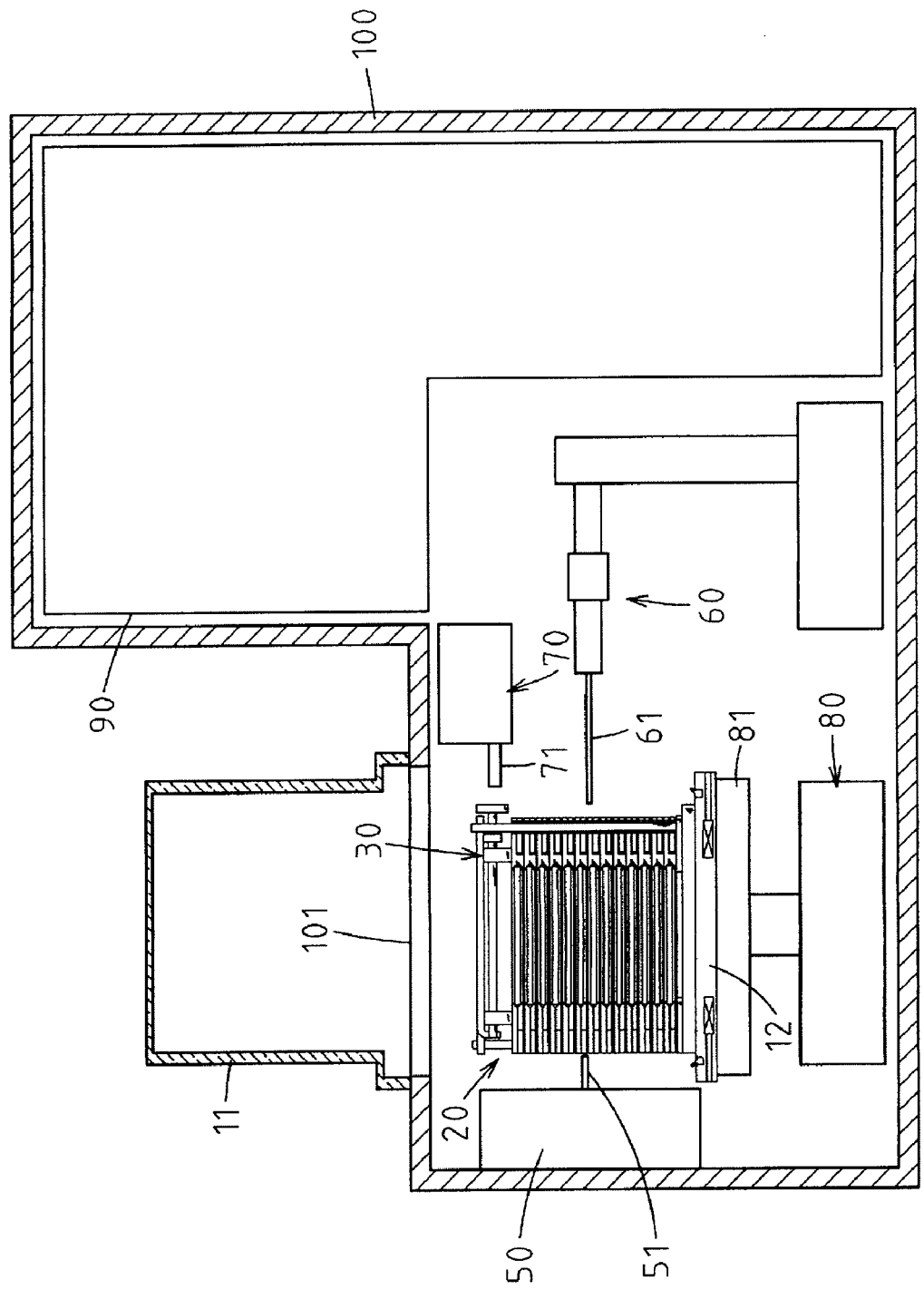
FIG. 14 is a schematic view of a processing apparatus that performs automatic control to unload a semiconductor wafer from the semiconductor wafer container according to the first embodiment of the present invention.

FIG. 14 schematically shows a processing apparatus that automatically performs the above-described operation of unloading the semiconductor wafer W. The apparatus has a closed casing 100, which is open only at a hole 101, through which the container body 11 cannot pass. In the closed casing 100 are disposed an elevating table 81 (and a driving device 80 therefor) that moves up and down with the wafer-retaining unit 20 supported thereon, the lifting arm 51 (and a driving device 50 therefor), the robot hand 61 (and driving device 60 therefor), and the clamp driving arm 71 (and a driving device 70 therefor). Reference numeral 90 denotes a processing chamber for processing a semiconductor wafer W unloaded from the wafer-retaining unit 20.

Figure 15:
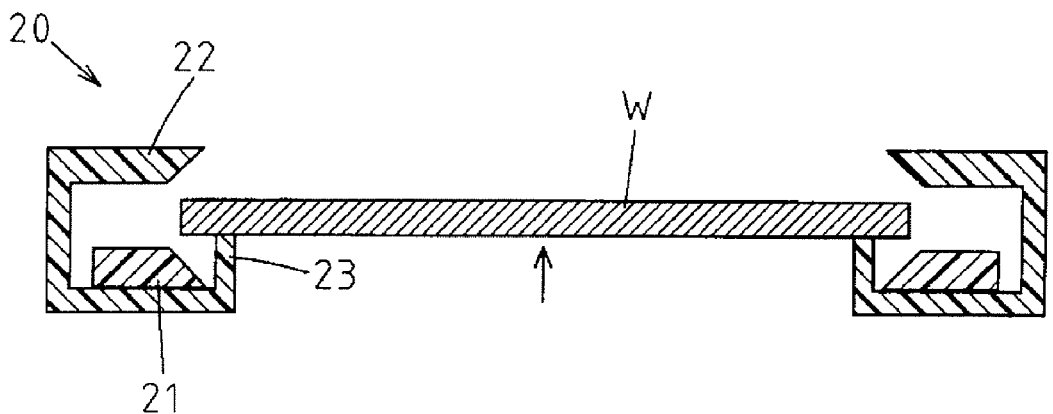
FIG. 15 is an end view of a single-wafer retaining section in a second embodiment of the present invention (a sectional view showing only a sectional configuration).
Figure 16:
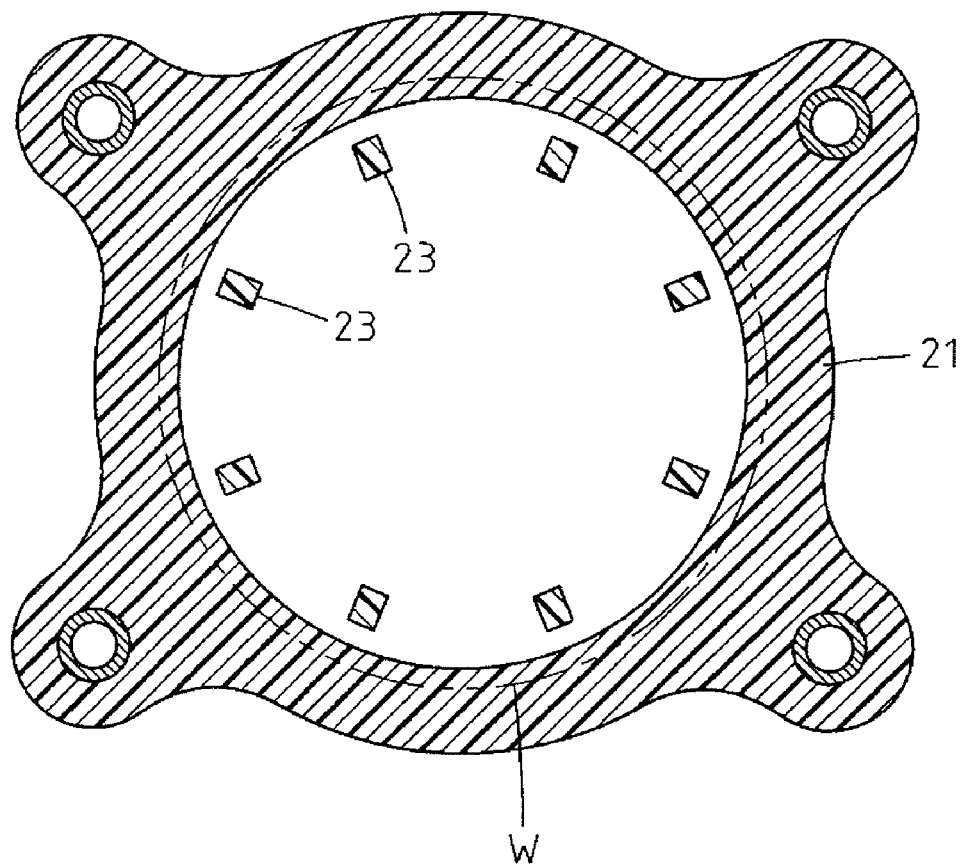
FIG. 16 is a sectional plan view showing a wafer-retaining frame and wafer lift members in the second embodiment of the present invention.
Figure 17:
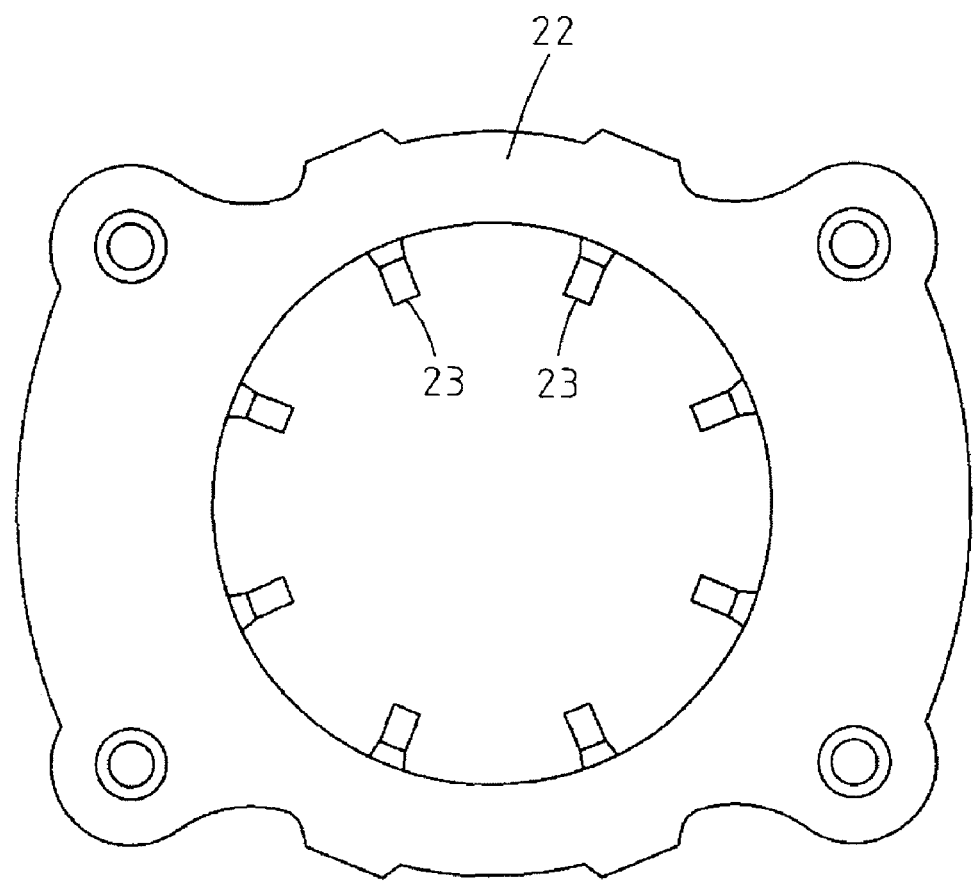
FIG. 17 is a plan view showing a wafer-securing frame and wafer lift members in the second embodiment of the present invention.

It should be noted that the present invention is not limited to the foregoing embodiment but can be embodied in a variety of ways. For example, the arrangement may be as shown schematically in FIGS. 15 to 17. That is, the wafer-retaining frame 21 retains the semiconductor wafer W at the entire circumference thereof, and the wafer lift members 23 lift up the semiconductor wafer W at a plurality positions (i.e. a plurality of dispersed positions) radially inward of the position at which the semiconductor wafer W is retained by the wafer-retaining frame 21 (i.e. radially inward of the peripheral edge of the semiconductor wafer W). In this case, it is desirable that the contact surface of each wafer lift member 23 at which it contacts the semiconductor wafer W should be a plane or curved surface (e.g. a spherical surface) but not a slant surface.

Figure 18:
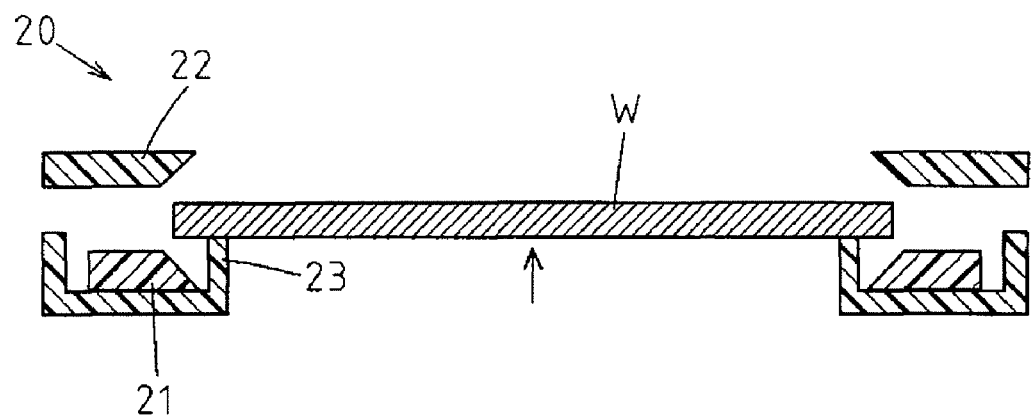
FIG. 18 is an end view of a single-wafer retaining section in a semiconductor wafer container according to a third embodiment of the present invention.
Figure 19:
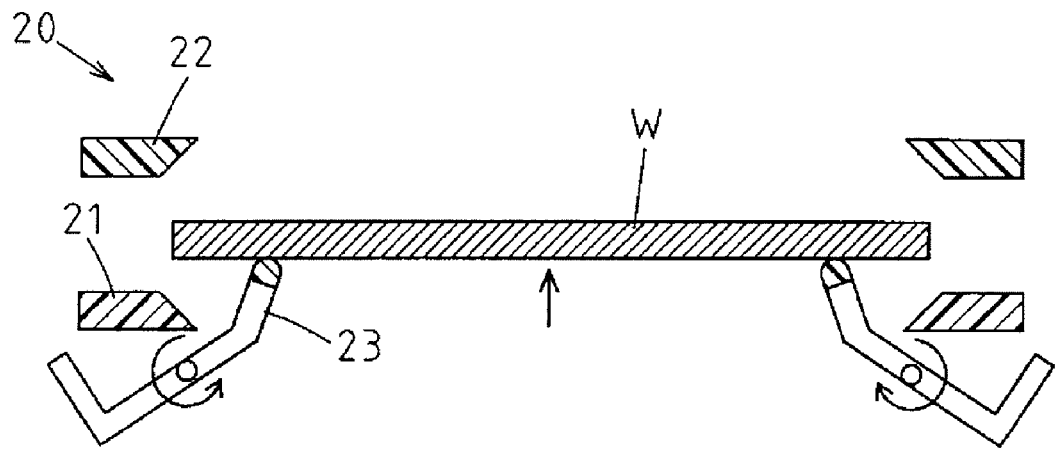
FIG. 19 is an end view of a single-wafer retaining section in a semiconductor wafer container according to a fourth embodiment of the present invention.

The arrangement may be as shown in FIG. 18. That is, the wafer lift members 23 are not connected with the wafer-securing frame 22, but they are driven by wafer lift driving means (not shown) provided outside the wafer-retaining unit 20 to translate parallel to a vertical direction. Alternatively, as shown in FIG. 19, the wafer lift members 23 may be arranged to pivot about respective pivots by being driven by wafer lift driving means (not shown).

Figure 20:
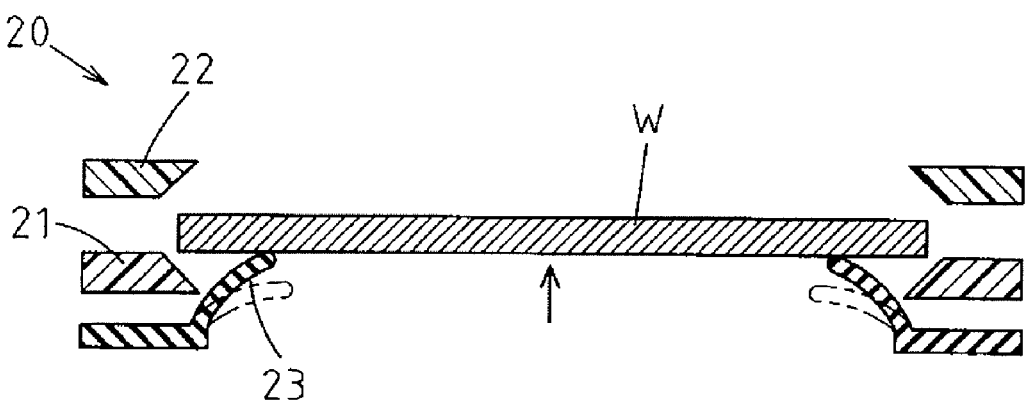
FIG. 20 is an end view of a single-wafer retaining section in a semiconductor wafer container according to a fifth embodiment of the present invention.
Figure 21:
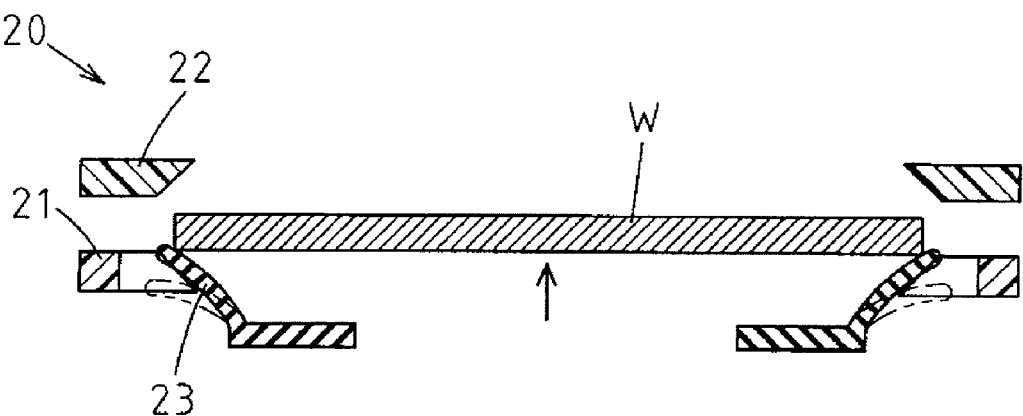
FIG. 21 is an end view of a single-wafer retaining section in a semiconductor wafer container according to a sixth embodiment of the present invention.

The arrangement may be as shown in FIGS. 20 and 21. That is, the wafer lift members 23 are formed of an elastic material and disposed in the state of being urged to constantly lift up the semiconductor wafer W from below. When the wafer-securing frame 22 retracts upward, the wafer lift members 23 lift up the semiconductor wafer W by their own biasing forces. FIG. 20 shows a structural example in which the wafer lift members 23 abut against the lower side of the semiconductor wafer W. FIG. 21 shows a structural example in which the wafer lift members 23 abut against the lower end edge portion of the outer periphery of the semiconductor wafer W.

Figure 22:
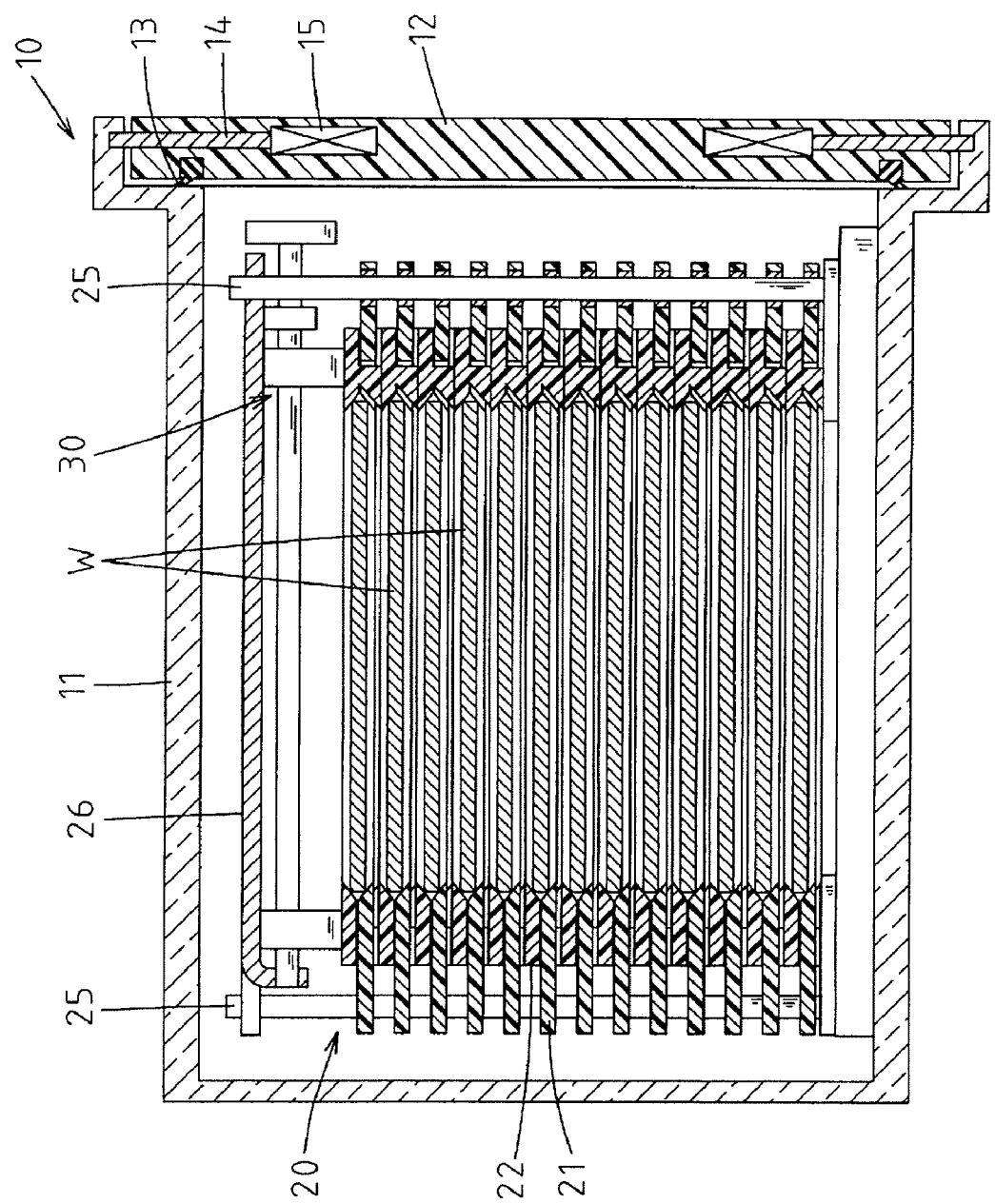
FIG. 22 is a sectional front view of a semiconductor wafer container according to a seventh embodiment of the present invention, showing the way in which semiconductor wafers are accommodated in the semiconductor wafer container.

The present invention may be arranged as shown in FIG. 22. That is, the sealed container 10 includes a container body 11 having an opening in a side thereof, a cover 12 that is detachably attached to the opening, and a seal member 13 that seals the gap between the container body 11 and the cover 12. Guide posts 25 for the wafer-retaining unit 20 are stood in the container body 11.

In this embodiment, a semiconductor wafer W is loaded into or unloaded from the wafer-retaining unit 20 as follows. First, the cover 12, which is located at one side of the sealed container 10, is removed from the sealed container 10 and moved downward. With the wafer-retaining unit 20 left in the sealed container 10, a semiconductor wafer W is loaded or unloaded through the opening at the side of the sealed container 10, from which the cover 12 has been removed, according to the same procedure as in the foregoing first embodiment.

It should be noted that the wafer-retaining unit 20 in this embodiment adopts the structure shown in FIG. 7, in which each wafer-securing frame 22 is integrally connected to a wafer-retaining frame 21U upwardly adjacent thereto. The wafer-retaining unit 20, however, may have a structure similar to that in the first embodiment, in which each wafer-securing frame 22 is not integrally connected to a wafer-retaining frame 21U upwardly adjacent thereto.

The invention claimed is:

1. A semiconductor wafer container comprising: an openable and closable container; and
   a wafer-retaining unit provided in said container to retain a plurality of semiconductor wafers independently of and parallel to each other;
   wherein the plurality of semiconductor wafers are each horizontally oriented at least when the semiconductor wafers are to be loaded into or unloaded from said wafer-retaining unit;
   said wafer-retaining unit having a plurality of vertically superimposed single-wafer retaining sections, each of said single-wafer retaining sections comprising:
   a wafer-retaining frame retaining a single semiconductor wafer horizontally by abutting against only a lower end edge portion of an outer periphery of the semiconductor wafer;
   a wafer-securing frame that is vertically movably relative to said wafer-retaining frame, said wafer-securing frame abutting against only an upper end edge portion of the outer periphery of the semiconductor wafer retained by said wafer-retaining frame, thereby holding the semiconductor wafer in a fixed position between said wafer-retaining frame and said wafer-securing frame; and
   a wafer lift member disposed underneath the semiconductor wafer held between said wafer-retaining frame and said wafer-securing frame, said wafer lift member moving upward in response to movement of said wafer-securing frame relative to said wafer-retaining frame, thereby lifting the semiconductor wafer to a predetermined position where the semiconductor wafer is upwardly spaced from said wafer-retaining frame, and keeping the semiconductor wafer in the predetermined position.

2. The semiconductor wafer container of claim 1, wherein said wafer-retaining frame is an annular frame member having an obliquely slanted surface that abuts against the lower end edge portion of the semiconductor wafer from below, and said wafer-securing frame is an annular frame member having an obliquely slanted surface that abuts against the upper end edge portion of the semiconductor wafer from above.

3. The semiconductor wafer container of claim 2, wherein the slanted surface of said wafer-retaining frame and the slanted surface of said wafer-securing frame form, in combination, a V-shaped sectional shape that abuts against the upper end edge portion and lower end edge portion of the outer periphery of the semiconductor wafer.

4. The semiconductor wafer container of claim 1, wherein a wafer-retaining frame of a first single wafer retaining section is integrally connected to a wafer-securing frame of a single-wafer retaining section that is downwardly adjacent to the first single-wafer retaining section.

5. The semiconductor wafer container of claim 1, wherein said wafer-retaining frame retains the semiconductor wafer at a plurality of circumferentially spaced positions, and said wafer lift member lifts the semiconductor wafer at portions of an outer edge of the semiconductor wafer that are not retained by said wafer-retaining frame.

6. The semiconductor wafer container of claim 1, wherein said wafer-retaining frame retains said the semiconductor wafer at an entire circumference of the semiconductor wafer, and said wafer lift member lifts up the semiconductor wafer at a position radially inward of a position at which the semiconductor wafer is retained by said wafer-retaining frame.

7. The semiconductor wafer container of claim 1, wherein said wafer lift member is arranged to lift up the semiconductor wafer at a plurality of dispersed positions near a peripheral edge of the semiconductor wafer.

8. The semiconductor wafer container of claim 1, wherein said wafer lift member is integrally connected to said wafer-securing frame.

9. The semiconductor wafer container of claim 1, wherein said wafer lift member comprises of an elastic material to urge the semiconductor wafer upward from below.

10. The semiconductor wafer container of claim 1, wherein said plurality of single-wafer retaining sections are individually retained by a plurality of upright guide posts, said single-wafer retaining sections being vertically slidable along said guide posts.

11. The semiconductor wafer container of claim 10, wherein a space between at least two of said plurality of guide posts is larger than a diameter of the semiconductor wafer, so that the semiconductor wafer can be loaded into and unloaded from said wafer-retaining unit through the space between the two of said guide posts.

12. The semiconductor wafer container of claim 10, further comprising a clamp mechanism switchable between an unlocked position where all vertically superimposed single-wafer retaining sections retained by said guide posts are movable along said guide posts and a locked position where all the single-wafer retaining sections are not movable along said guide posts.

13. The semiconductor wafer container of claim 12, wherein said clamp mechanism has a horizontally disposed rotary connecting shaft and an eccentric roller mounted on the rotary connecting shaft, so that all the single-wafer retaining sections can be brought into the lock position by pressing an outer peripheral surface of said eccentric roller against an upper end frame surface of said wafer-retaining unit.

14. The semiconductor wafer container of claim 13, wherein said clamp mechanism is provided with a connecting part for connecting a clamp mechanism driver provided outside said wafer-retaining unit to the rotary connecting shaft of said clamp mechanism.

15. The semiconductor wafer container of claim 10, wherein any wafer-securing frame in said wafer-retaining unit can be moved upward, together with all single-wafer retaining sections above said wafer-securing frame, by a securing frame lifter provided outside said wafer-retaining unit.

16. The semiconductor wafer container of claim 10, wherein said container has a container body having an opening in a bottom thereof, a cover detachably attached to the opening, and a seal member that seals a gap between said container body and said cover, said guide posts being stood on said cover.

17. The semiconductor wafer container of claim 10, wherein said container has a container body having an opening in a side thereof, a cover detachably attached to the opening, and a seal member that seals a gap between said container body and said cover, said guide posts being supported in said container body.

18. The semiconductor wafer container of claim 1, further comprising a clamp mechanism configured to selectively lock all of the single wafer retaining sections at a fixed position, said clamp mechanism including a rotary shaft and an eccentric roller mounted on the rotary shaft, wherein all of the single wafer retaining sections are locked by pressing an outer peripheral surface of said eccentric roller against an upper end frame surface of said wafer retaining unit.

19. The semiconductor wafer container of claim 1, wherein movement of said wafer securing frame upwards relative to said wafer retaining frame releases an elastic biasing force of said wafer lift member to lift said semiconductor wafer.

20. The semiconductor wafer container of claim 1, wherein said wafer securing frame is vertically movable relative to said wafer retaining frame while said single wafer retaining section is said wafer retaining unit.

* * * * *